US012026001B2

(12) United States Patent
Forte et al.

(10) Patent No.: US 12,026,001 B2
(45) Date of Patent: Jul. 2, 2024

(54) LDO-BASED ODOMETER TO COMBAT IC RECYCLING

(71) Applicant: University of Florida Research Foundation, Incorporated, Gainesville, FL (US)

(72) Inventors: Domenic J. Forte, Gainesville, FL (US); Nima Maghari, Gainesville, FL (US); Michael Levin, Gainesville, FL (US); Sreeja Chowdhury, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 216 days.

(21) Appl. No.: 17/808,185

(22) Filed: Jun. 22, 2022

(65) Prior Publication Data

US 2023/0085919 A1 Mar. 23, 2023

Related U.S. Application Data

(60) Provisional application No. 63/215,148, filed on Jun. 25, 2021.

(51) Int. Cl.
*G05F 1/56* (2006.01)
*G01R 31/28* (2006.01)

(52) U.S. Cl.
CPC ........... *G05F 1/56* (2013.01); *G01R 31/2851* (2013.01)

(58) Field of Classification Search
CPC .............................. G05F 1/56; G01R 31/2851
USPC ................................... 324/762.01, 537, 500
See application file for complete search history.

(56) References Cited

U.S. PATENT DOCUMENTS

| | | | |
|---|---|---|---|
| 10,036,773 B1 | 7/2018 | Ghosh et al. | |
| 10,976,360 B2 | 4/2021 | Ghosh et al. | |
| 2019/0265293 A1* | 8/2019 | Fifield | G01R 31/2642 |
| 2020/0333821 A1* | 10/2020 | Tomonaga | G05F 3/16 |
| 2021/0081574 A1 | 3/2021 | Chowdhury et al. | |
| 2023/0213577 A1* | 7/2023 | Auvray | G01R 15/22 |
| | | | 324/762.01 |

* cited by examiner

*Primary Examiner* — Giovanni Astacio-Oquendo
(74) *Attorney, Agent, or Firm* — Alston & Bird LLP

(57) ABSTRACT

A method and system are directed to designing a low-dropout regulator (LDO) circuit and using the LDO circuit to detect recycled counterfeit integrated circuits. The LDO circuit includes, in part, a reference path circuit and a stressed path circuit. Each of the reference path circuit and the stressed path circuit is coupled to a control signal that can enable the corresponding path circuit for the LDO. LDO parameters can then be measured while the reference path circuit and the stressed path circuit is enabled respectively. The difference between the LDO parameters measured while the reference path circuit is enabled and while the stressed path circuit is enabled is used to determine if an integrated circuit comprising the LDO circuit is a recycled counterfeit.

19 Claims, 7 Drawing Sheets

LDO-BASED ODOMETER TO COMBAT IC RECYCLING

CROSS REFERENCE TO RELATED APPLICATIONS

This application claims the benefit of U.S. Provisional Patent Application No. 63/215,148, titled "LDO-BASED ODOMETER TO COMBAT IC RECYCLING," filed Jun. 25, 2021, which is incorporated by reference herein in its entirety.

GOVERNMENT SUPPORT

This invention was made with government support under FA8650-19-1-1741 awarded by US AIR FORCE AFOSR. The government has certain rights in the invention.

FIELD OF THE INVENTION

The present disclosure relates generally to detecting counterfeit chips, and more particularly, to methods, apparatuses, and systems for detecting a recycled counterfeit integrated circuit by monitoring changes in parameters of a low dropout regulator.

BACKGROUND

Recycled chips have been known to be maliciously taken off of printed circuit boards (PCBs) and inserted back into the supply chain to be sold as new. This causes a major concern for critical system reliability because such chips are prone to faulty and premature failure. With the abundance of analog and mixed signal (AMS) and digital integrated circuits (ICs) in critical systems today, a proportionate rise in counterfeit ICs poses a serious threat to mission success and, in some cases, human lives. By 2030, it is projected that the number of internet of things (IoT) devices will reach 125 billion, and therefore, a commensurate rise in electronic waste will induce a surge in counterfeit electronics.

Hardware security primitives have been widely studied to combat counterfeit chips. Earlier work in counterfeit detection includes design implementations such as physical unclonable functions (PUF) for IC authentication and electronic chip identification. Apart from PUFs, combating die and IC recycling (CDIR) sensors/odometers have been established as a low-cost option for detecting recycled digital ICs. CDIRs are embedded within digital ICs and use ring oscillators (ROs) to measure aging by applying a self-referencing concept. For example, two ROs may be embedded very close together inside a chip and their frequencies are compared to detect prior IC usage. One RO may be referred to as the reference RO and it is designed to not experience stress under normal operating conditions. The second RO may be referred to as the stressed RO and it is designed to age during normal operating conditions at a much faster rate than the reference RO. As the IC is used in the field, the stressed RO's rapid aging reduces its oscillation frequency while the reference RO's oscillation frequency remains static over the chip's lifetime. Therefore, a large disparity between the ROs frequencies would imply that the chip has been used. The best CDIRs should possess minimal aging in the reference RO and maximum aging for the stressed RO for improved sensitivity and accuracy. CDIRs may be designed in multiple fashions and can be used on a variety of digital ICs to protect against IC recycling.

Although CDIRs have a lightweight structure suitable for digital ICs, counterfeit detection and avoidance has been less studied in AMS circuits. AMS ICs differ greatly from digital ICs; therefore, security primitives need to be secure and reliable along with strict constraints on area, power, pins, clock, etc. Thus, there are challenges and opportunities in improvement related to analog counterfeit detection and avoidance.

BRIEF SUMMARY

Various embodiments described herein relate to methods, apparatuses, and systems for detecting recycled counterfeit integrated circuits.

In accordance with various embodiments of the present disclosure, a circuit for detecting a recycled counterfeit integrated circuit (IC) is provided. In some embodiments, the circuit comprises an error amplifier, a resistor divider, a reference path circuit, and a stressed path circuit. An output of the error amplifier is coupled to an output of the circuit through both the reference path circuit and the stressed path circuit. The resistor divider is coupled between the output of the circuit and a ground. A first input of the error amplifier is coupled to a voltage reference signal. A second input of the error amplifier is coupled to an output of the resistor divider. The reference path circuit is coupled to a first control signal, wherein the first control signal selectively enables the reference path circuit. The stressed path circuit is coupled to a second control signal, wherein the second control signal selectively enables the stressed path circuit.

In some embodiments, the reference path circuit comprises a reference pass transistor, and the stressed path circuit comprises a stressed pass transistor. In some embodiments, the reference path circuit further comprises a first pull-up transistor and a second pull-up transistor, wherein the first pull-up transistor and the second pull-up transistor are coupled to the reference pass transistor, and the stressed path circuit further comprises a third pull-up transistor and a fourth pull-up transistor, wherein the third pull-up transistor and the fourth pull-up transistor are coupled to the stressed pass transistor.

In some embodiments, the reference pass transistor, the stressed pass transistor, the first pull-up transistor, the second pull-up transistor, the third pull-up transistor, and the fourth pull-up transistor are P-channel metal-oxide-semiconductor (PMOS). In some embodiments, the source terminals of the reference pass transistor, the stressed pass transistor, the first pull-up transistor, the second pull-up transistor, the third pull-up transistor, and the fourth pull-up transistor are coupled to a voltage supply. In some embodiments, the reference path circuit further comprises a first inverter, an input of the first inverter is coupled to the first control signal, and an output of the first inverter is coupled to gates of the first pull-up transistor and the second pull-up transistor, and the stressed path circuit further comprises a second inverter, an input of the second inverter is coupled to the second control signal, and an output of the second inverter is coupled to gates of the third pull-up transistor and the fourth pull-up transistor.

In some embodiments, the reference path circuit further comprises a first switch and a second switch, the output of the error amplifier is coupled to the reference pass transistor through the first switch, an output of the reference pass transistor is coupled to the output of the circuit through the second switch, and the stressed path circuit further comprises a third switch and a fourth switch, the output of the error amplifier is coupled to the stressed pass transistor through the third switch, an output of the stressed pass transistor is coupled to the output of the circuit through the fourth switch. In some embodiments, the first switch, the second switch, the third switch, and the fourth switch are transmission gates. In some embodiments, the first switch and the second switch are controlled by the first control signal, and the third switch and the fourth switch are controlled by the second control signal.

In accordance with various embodiments of the present disclosure, a method of detecting a recycled counterfeit integrated circuit (IC) is provided. In some embodiments, the method comprises forming a reference path circuit for a low-dropout regulator (LDO) on an IC, wherein the reference path circuit is coupled to a first control signal, forming a stressed path circuit for the LDO on the IC, wherein the stressed path circuit is coupled to a second control signal, and determining whether the IC is a recycled counterfeit based at least on comparison of LDO parameters measured while the stressed path circuit is enabled and LDO parameters measured while the reference path circuit is enabled, wherein the stressed path circuit is enabled by the second control signal and the reference path circuit is enabled by the first control signal.

In some embodiments, the reference path circuit comprises a reference pass transistor, and the stressed path circuit comprises a stressed pass transistor. In some embodiments, the reference path circuit further comprises a first pull-up transistor and a second pull-up transistor, wherein the first pull-up transistor and the second pull-up transistor are coupled to the reference pass transistor, and the stressed path circuit further comprises a third pull-up transistor and a fourth pull-up transistor, wherein the third pull-up transistor and the fourth pull-up transistor are coupled to the stressed pass transistor. In some embodiments, the reference pass transistor, the stressed pass transistor, the first pull-up transistor, the second pull-up transistor, the third pull-up transistor, and the fourth pull-up transistor are PMOS.

In some embodiments, the source terminals of the reference pass transistor, the stressed pass transistor, the first pull-up transistor, the second pull-up transistor, the third pull-up transistor, and the fourth pull-up transistor are coupled to a voltage supply. In some embodiments, the reference path circuit further comprises a first inverter, an input of the first inverter is coupled to the first control signal, and an output of the first inverter is coupled to gates of the first pull-up transistor and the second pull-up transistor, and the stressed path circuit further comprises a second inverter, an input of the second inverter is coupled to the second control signal, and an output of the second inverter is coupled to gates of the third pull-up transistor and the fourth pull-up transistor.

In some embodiments, the reference path circuit further comprises a first switch and a second switch, an output of an error amplifier is coupled to the reference pass transistor through the first switch, an output of the reference pass transistor is coupled to an output of the IC through the second switch, and the stressed path circuit further comprises a third switch and a fourth switch, the output of the error amplifier is coupled to the stressed pass transistor through the third switch, an output of the stressed pass transistor is coupled to the output of the IC through the fourth switch. In some embodiments, the first switch, the second switch, the third switch, and the fourth switch are transmission gates. In some embodiments, the first switch and the second switch are controlled by the first control signal, and the third switch and the fourth switch are controlled by the second control signal. In some embodiments, the LDO parameters comprise at least one of power supply rejection ratio (PSRR), dropout voltage, load regulation, ground current, or operating regions.

BRIEF DESCRIPTION OF THE DRAWINGS

Reference will now be made to the accompanying drawings, which are not necessarily drawn to scale, and wherein.

DETAILED DESCRIPTION OF THE INVENTION

Figure 1:
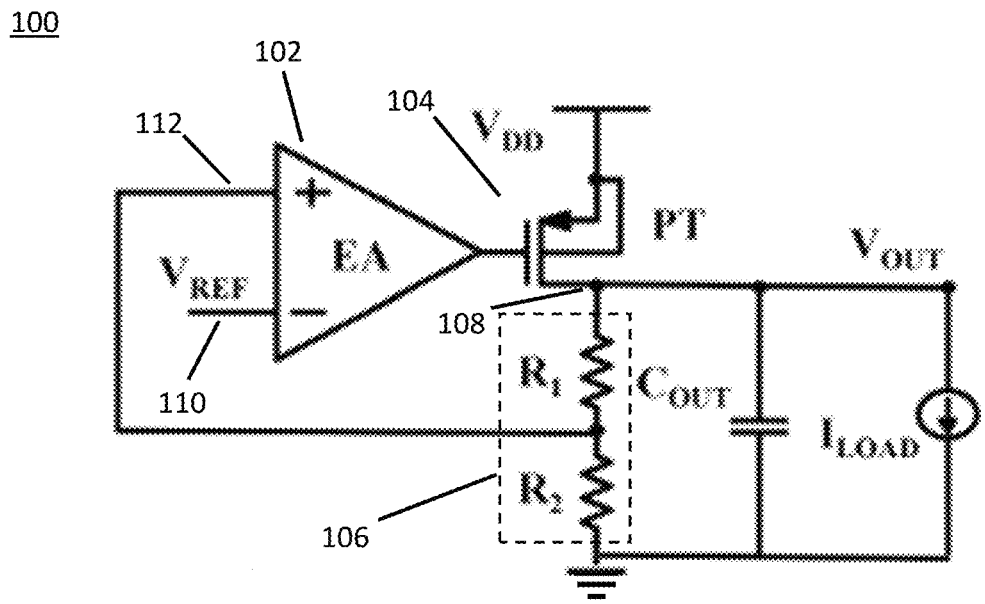
FIG. 1 illustrates an example block diagram of a low dropout regulator (LDO) in accordance with various embodiments of the present disclosure.

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to be examples with no indication of quality level. Like numbers refer to like elements throughout.

OVERVIEW

Recycled counterfeit integrated circuits (ICs) may refer to used chips that were removed from improperly disposed electronics and resold in the market as new. Recycled ICs are prone to early failure and serve as a threat to reliability which can be very dangerous if found in critical applications. Although recycled IC detection methods have been researched, there lacks a solution that serves for every chip type and scenario. For example, hardware security primitives have been primarily developed for digital circuits but cannot be directly ported to analog and mixed signal (AMS)

chips. AMS primitives should maintain security and reliability along with stringent constraints on area, power, pins, clock, etc.

An odometer is an instrument commonly used to measure a distance traversed by a vehicle—this distance can be associated with the vehicles "wear and tear." In the case of recycled IC detection, an odometer can be used to measure the "distance" between an IC's original performance and its current (used) performance. Odometer-based systems have commonly consisted of ring oscillators (RO) to accurately measure frequency degradation due to aging. Low dropout regulator (LDO) aging and resulting power supply rejection ratio (PSRR) degradation have also been experimentally studied for standalone LDOs. PSRR, which is also known as ripple rejection, measures the LDO's ability to prevent the regulated output from fluctuations caused by input voltage variations. Conventional LDO's include pass transistors that significantly age with alternating current (AC) and direct current (DC) stress. PSRR degradation may be used to detect recycled LDOs and recycled systems on chip (SoCs) containing LDOs.

Various embodiments of the disclosure generally relate to a system and method that takes advantages of a new LDO design with odometer capabilities to determine with high accuracy if a chip is new or recycled. More specifically, various embodiments of the present disclosure are related to using a custom-LDO containing two distinct feedback pass transistor (PT) paths: a reference path and a stressed path. Under the normal operation mode, the stressed PT will age from use while the reference PT is put in its low stress condition to avoid aging. Under the test mode, by monitoring the changes in parameters for LDO as it switches from stressed to reference paths, the chip can be characterized as new or recycled.

Example Apparatus Architecture for Implementing Embodiments of the Present Disclosure Low Dropout Regulators (LDOs) and IC Aging LDO's may comprise a type of DC regulator which maintains an output voltage when an input voltage is very close to the output voltage (low drop-out). LDOs may be embedded inside the power management circuitry of ICs to provide a stable voltage for the rest of the circuit. Drop-out voltage may be defined as the input-to-output differential voltage, where the regulator fails to regulate the output voltage until further reduction of the input voltage. The role of an LDO is indispensable in the power supply of many SoC/IC. An LDO may provide isolation between the input and output voltages, thus preventing the introduction of noise and ripples (glitches) from the input power supply to the output to provide a stable, low noise, fixed output voltage.

FIG. 1 presents an example block diagram of a low dropout regulator (LDO) 100. The LDO 100 comprises a feedback loop with an error amplifier (EA) 102, a pass transistor (PT) 104 and a resistor divider 106, as shown in FIG. 1. The PT 104 may behave as a variable resistor that can be controlled by the EA 102 and feedback resister divider 106 to regulate the output voltage 108. Input 110 of the EA is coupled to a fixed voltage reference, and input 112 of the EA is coupled to the feedback resistor divider 106 and receives level-shifted output voltage 108 through the feedback resistor divider 106. The EA 102 monitors the difference between the input and output voltages of the circuit (i.e., $V_{DD}$ and $V_{out}$, respectively), and controls the gate voltage of the PT to regulate the output at a desired stable voltage. In some embodiments, the PT can be P-channel metal-oxide-semiconductor (PMOS). In some other embodiments, the PT may be N-channel metal-oxide-semiconductor (NMOS).

Figure 2A:
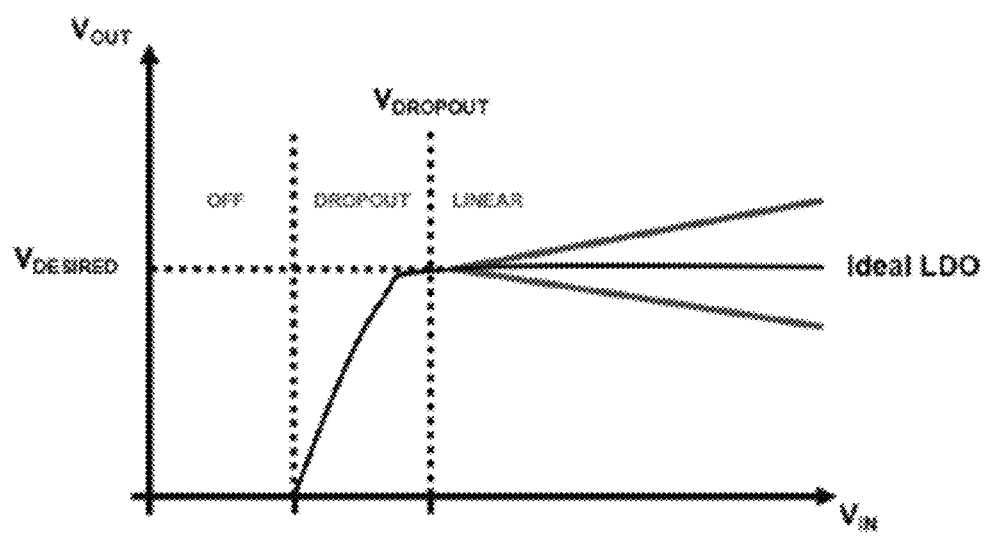
FIG. 2A illustrates typical operating regions of an LDO in accordance with various embodiments of the present disclosure.

FIG. 2A presents operating regions of an LDO. An LDO may operate in three different regions: a linear region (where the feedback loop regulates $V_{out}$), dropout region (where the circuit operates with very little feedback), and off region (where the circuit no longer regulates $V_{out}$). The dropout voltage ($V_{DROPOUT}$) may comprise an input-to-output differential voltage at which the LDO circuit ceases to regulate against further reductions in input voltage. As long as the operating input voltage is not below the dropout voltage, the output may be regulated with very good stability.

According to various embodiments of the present disclosure, power supply rejection ration (PSRR) may used to characterize the performance of an LDO. PSRR can measure the ability of suppressing the variations of the input power supply at its output. These variations or ripples can arise from the power supply itself, from the DC/DC converter, or from different intermediate circuits within the system that share the same supply. Equation (1) below shows the mathematical representation of PSRR expressed in decibels or dB.

$$PSRR[\text{in dB}] = 20\log_{10}\left(\frac{V_{OUT}}{V_{DD}}\right) \tag{1}$$

Figure 2B:
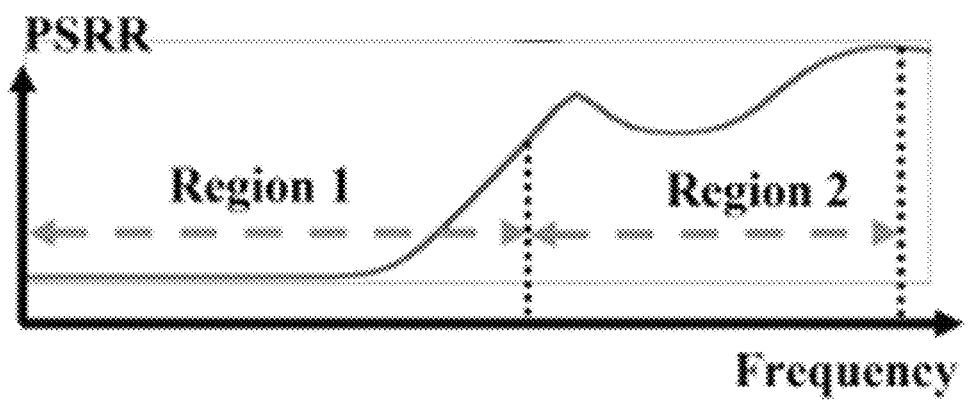
FIG. 2B illustrates exemplary regions of a power supply rejection ration curve in accordance with various embodiments of the present disclosure.

The PSRR curve of most LDOs can be divided into two distinct regions as shown in FIG. 2B: Region 1 in the low and mid frequency range and Region 2 located in the higher frequency range. Region 1 may be dictated by the DC loop gain of the LDO which comprises of the gain of the EA, the PT, and the resistor divider 106 at the output terminal. Region 2 may be affected by the output capacitor and the intrinsic parasitic capacitance of the input, the output, and the PT.

IC aging may be defined as the change or degradation of the performance of a circuit over time, and is regarded as one of the main causes of reliability issues faced in modern ICs especially for circuits integrated in 65 nm CMOS technology and lower. This phenomena may be mostly the result of two different mechanisms that become prominent over time: hot carrier injection (HCI) and bias temperature instability (BTI).

HCI may be caused by fast-moving electrons or carriers which gain enough energy to be injected into the gate after a certain time of use. This creates traps at the silicon substrate and hence results in the degradation of device characteristics such as the threshold voltage ($V_{th}$). This mechanism may be modeled as a power law dependence on stress time as reported in and the damage increases exponentially with increasing VGS and VDS as shown in Equation (2) below, where $n_{HC}$ represents the time exponent, $\alpha_3$ and $\alpha_4$ are technology-dependent voltage scaling parameters, and L is the length of the transistor.

$$\Delta V_{th} \approx \frac{1}{\sqrt{L}} t^{n_{HC}} \exp(\alpha_3 V_{GS})\exp(\alpha_4 V_{DS}) \tag{2}$$

BTI may be characterized as a temperature-activated mechanism and may be caused by constant electric fields degrading the dielectric. This in turn traps the hole in the dielectric bulk and degrades the threshold voltage of the transistor. When a device is turned off however, the trapped holes are released, and the device immediately enters the recovery phase. In a typical device with silicon dioxide or silicon-oxynitride dielectric, BTI mainly affects PMOS transistors (i.e., negative BTI). The change in threshold voltage ($\Delta V_{th}$) as a result of BTI can be modeled as Equation (3) below, where $\alpha_1$ and $\alpha_2$ are the voltage scaling factors, $n_p$ and $n_R$ are the time exponents, and $C_R$ is a process dependent capacitance value.

$$\Delta V_{th} \approx \exp(\alpha_1 V_{GS})t^{n_p} + V_{GS}^{\alpha_2}(C_R + n_R \log_{10}(t)) \quad (3)$$

Experimentally it has been shown that as the time of device use increases, BTI dominates the effects of HCI for a short period after which HCI causes equal or higher degradation in the device parameters compared to BTI.

LDO Odometer Design

Figure 3:
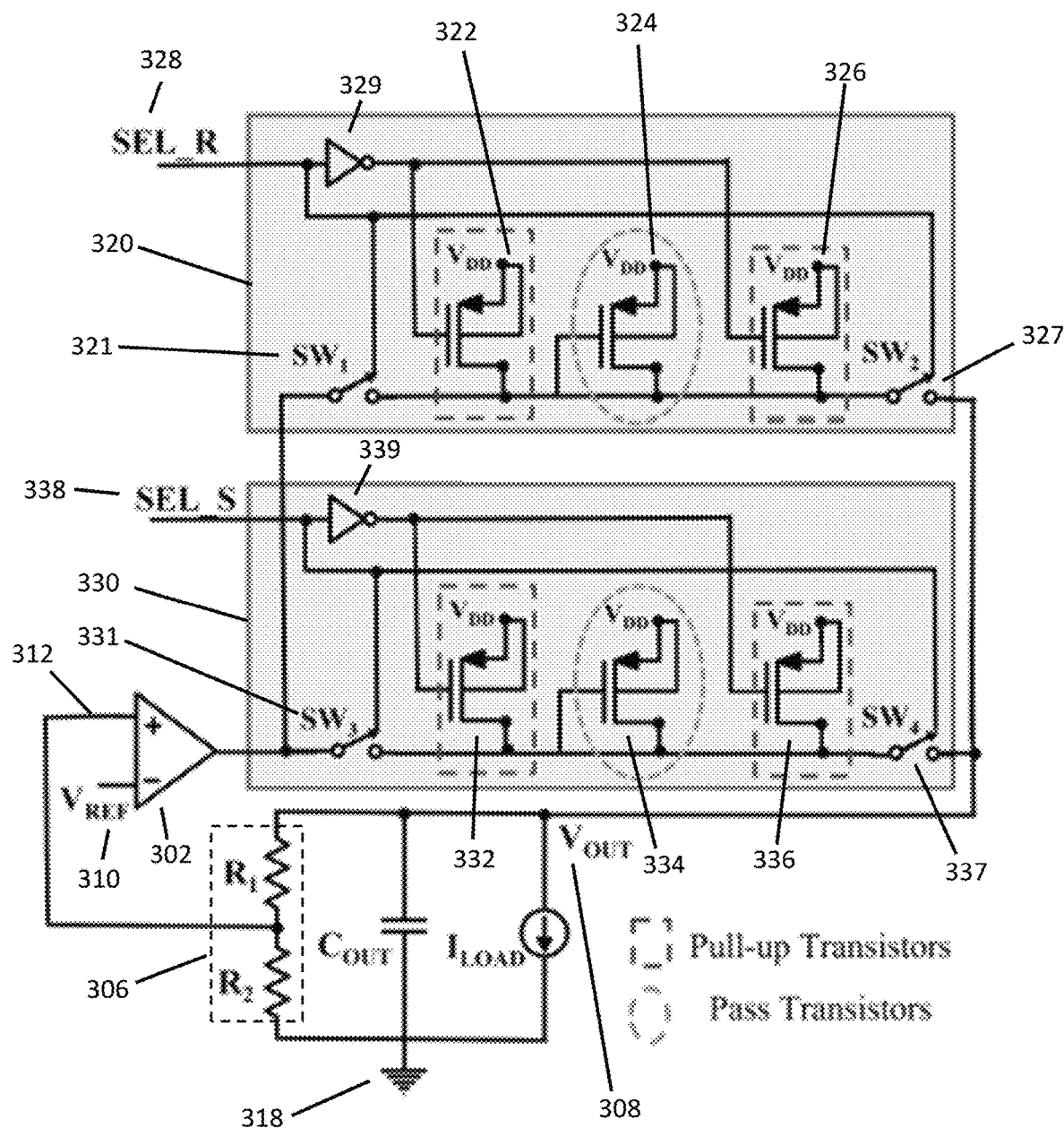
FIG. 3 illustrates an example block diagram of an LDO odometer, in accordance with some embodiments of the present disclosure.

FIG. 3 is an example block diagram of an LDO odometer 300, in accordance with some embodiments of the present disclosure. In some embodiments, the LDO odometer 300 comprises two distinct feedback PT paths: a reference path 320 and a stressed "normal" path 330. In some embodiments, the LDO odometer 300 comprises an error amplifier (EA) 302, which is coupled to the output voltage 308 through the reference path 320 or the stressed normal mode path 330. Input 310 of the EA 302 is coupled to a fixed voltage reference, and input 312 of the EA 302 is coupled to level-shifted output voltage 308 provided by the feedback resistor divider 306. The feedback resistor divider 306 comprises two resistors connected in series, which are connected between the output voltage 308 and ground 318.

In some embodiments, the reference path 320 comprises pull-up transistors (or sleep transistors) 322 and 326, and a reference pass transistor (PT) 324. In some embodiments, the pull-up transistors 322 and 326 and the reference PT 324 are PMOS. The source terminals of the pull-up transistors 322 and 326 and the source terminal of the reference PT 324 are all coupled to a voltage supply $V_{DD}$. The drain terminal of the pull-up transistor 322 is coupled to the gate terminal of the reference PT 324, and the drain terminal of the reference PT 324 is coupled to the drain terminal of the pull-up transistor 326. The gate of the reference PT 324 is also coupled to the output of the EA 302 through a high impedance switch 321, and the drain of the reference PT 324 is also coupled to the output voltage 308 through a high impedance switch 327.

Transistor aging is one of the main causes of reliability issues faced in modern ICs. Hot carrier injection (HCI) and bias temperature instability (BTI) are two major factors that induce transistor degradation in VLSI circuits fabricated at nanometer technology nodes. Hot carrier degradation has been modelled as a power law dependence on stress time and degradation increases exponentially with increasing gate-source voltage ($V_{gs}$) and drain-source voltage ($V_{ds}$). Transistor aging due to BTI results in a positive shift in the absolute value of the threshold voltage ($V_{th}$) in both P-channel metal-oxide-semiconductor (PMOS) and N-channel metal-oxide-semiconductor (NMOS) and is often referred to as DC stress when the transistor is pulled up/down. HCI often occurs under AC stress when the transistor is switching and causes the threshold voltage, transconductance, and saturation current to shift.

In some embodiments, the high impedance switches 321 and 327 comprise transmission gates that are controlled by a control signal 328 (or "SEL_R"). In addition, the control signal 328 (or "SEL_R") is coupled to the gate terminals of the pull-up transistors 322 and 326 through an inverter 329. When the control signal 328 is logic '0', the reference path 320 may be in high impedance. The complimented signal of the control signal 328 (i.e., the output of the inverter 329) may activates the pull-up transistors 322 and 326 in the reference path 320 to prevent the reference PT 324 from aging, i.e., $V_{gs}$ and $V_{ds}$ are approximately '0'. In this design, PMOS pull-up transistors (or sleep transistors) 322 and 326 are placed at the gate and drain, respectively, of the reference PT 324 to ensure low $V_{ds}$ and $V_{gs}$ to lower its stress under normal operating conditions. On the other hand, when the control signal 328 is logic '1', the reference path 320 may be selected (or enabled), causing the reference PT 324 to age from use.

In some embodiments, similar to the reference path 320, the stressed path 330 comprises pull-up transistors 332 and 336, and a stressed pass transistor (PT) 334. In some embodiments, the pull-up transistors 332 and 336 and the stressed PT 334 are PMOS. The source terminals of the pull-up transistors 332 and 336 and the source terminal of the stressed PT 334 are all coupled to a voltage supply $V_{DD}$. The drain terminal of the pull-up transistor 332 is coupled to the gate terminal of the stressed PT 334, and the drain terminal of the stressed PT 334 is coupled to the drain terminal of the pull-up transistor 336. The gate of the stressed PT 334 is also coupled to the output of the EA 302 through a high impedance switch 331, and the drain of the stressed PT 334 is also coupled to the output voltage 308 through a high impedance switch 337.

In some embodiments, the high impedance switches 331 and 337 are transmission gates that are controlled by a control signal 338 (or "SEL_S"). In addition, the control signal 338 (or "SEL_S") is coupled to the gate terminals of the pull-up transistors 332 and 336 through an inverter 339. When the control signal 338 is logic '1', the stressed path 330 is selected (or enabled) and causes the stressed PT 334 (or the stressed PT) to age from use. When the control signal 338 is logic '0', the stressed PT 334 will be put in its low stress condition to avoid aging.

Although PMOS is used in the example block diagram of the LDO odometer 300, in other embodiments, the disclosed PTs can be NMOS. In some embodiments, a charge pump may be required to regulate the voltage with an NMOS pass element. In some embodiments, the LDO odometer may be implemented in 65 nm technology.

In some embodiments, the switches are required to be large enough so that the $R_{on}$ of the transmission gate may be as small as possible, which can avoid extra resistance along the PTs drain path towards the load. Depending on how large the impedance is from the PTs drain to the output, a larger dropout region may occur and increase with larger current loads. In some embodiments, this is very critical for voltage stability if the operating voltage is within close proximity of the dropout region or if current loads are higher than expected.

LDO Odometer Modes of Operation

In some embodiments, to measure both the stressed and reference pass transistors, the LDO can function in multiple modes as shown in Table I. When a chip is initially fabricated and packaged, both the reference and stressed paths will be at their initial conditions. If the chip is tested post-fabrication, the measurement mode may be used. In the measurement mode, the SEL_S and SEL_R are switched between 0 and 1 so that both PTs undergo through initial aging for some equal amount of time. The SEL_S and SEL_R may oscillate at the same rate with complimentary phases. That is when SEL_S is 0, SEL_R is 1, and when SEL_S is 1, SEL_R is 0. In some embodiments, this can be accomplished by using a simple oscillator (not shown) that will slowly switch between stressed and reference paths to allow both pass transistors to age equally with a 50% duty cycle.

When the chip is used in the field, the normal operation mode may be used. This can be achieved by setting SEL_S to logic '1' and SEL_R to logic '0'. In normal operation mode, the stressed PT may age from use while the reference PT is put in its low stress condition to avoid aging. Throughout the chip's lifetime, the stressed PT may degrade and the LDO parameters such as PSRR, dropout voltage, load regulation, ground current, and operating regions will shift dramatically away from its reference. If a counterfeiter attempts to sell a recycled chip containing the LDO odometer in the market, it can be detected. To detect the recycled chip, the customer can put the chip into the measurement mode. By monitoring the changes in parameters for LDO as it switches from stressed to reference paths, the chip can be characterized as authentic (new) or counterfeit (recycled).

TABLE 1

MODES OF OPERATION

| Mode | Signals | | Description |
|---|---|---|---|
| | SEL R | SEL S | |
| Normal Operation | 0 | 1 | Stressed PT is aging (Chip is running normally) |
| Measurement | 0 | 1 | Both PTs are aging individually, for the same amount of time. |
| | 1 | 0 | (SEL R and SEL S are slowly oscillating at the same rate with complementary phases) |

Classification of Chip as Authentic or Recycled

According to some embodiments, a one-label classifier can be trained on different instances of an authentic LDO odometer. The classifier can use measurements of different LDOs taken during measurement mode and classify each chip as authentic or recycled. Similarly, a linear regression-based classifier may also be trained which can predict how long the chip has been recycled or used for. As an example, a Monte Carlo simulation may be used to create different instances of an LDO. In addition, a transistor aging model based on HCI and BTI as described above may be used to simulate the effects of transistor aging for different time scenarios. The aging model may describe the change in the threshold voltage of the transistor that mainly affects the transconductance of the EA and the pass transistor. The corresponding PSRR values for different times may be recorded for the simulated aging of the pass-transistor (PT). The PSRR values may then be used to train the linear regression classifier which when tested on an unseen recycled data can tell for how long that specific chip has been aged for.

Example Simulation Results of Various Embodiments

In some embodiments, an automated test setup was designed using Cadence's ADE-XL for simulating the LDO odometer's functionality. Results are shown in FIGS. 4-8.

Figure 4:
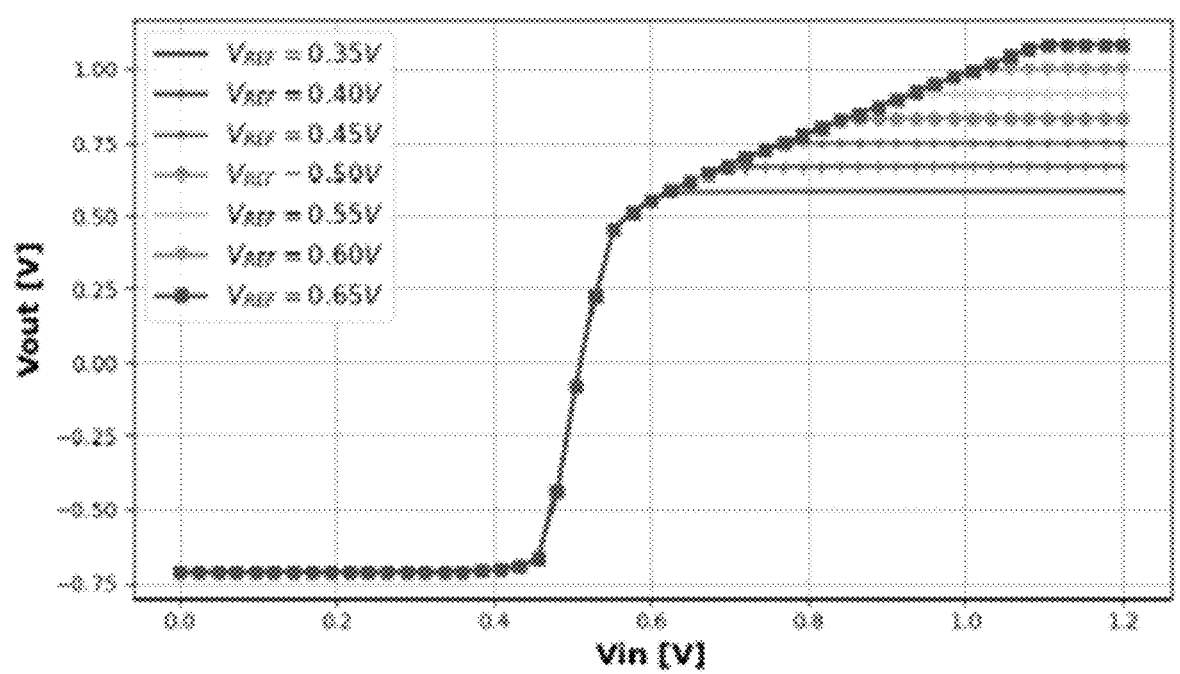
FIG. 4 illustrates an exemplary relationship between the supply voltage $V_{in}$ and the output voltage Gut of the LDO odometer for different reference voltages, in accordance with some embodiments of the present disclosure.

FIG. 4 presents an exemplary relationship between supply voltage $V_{in}$ and output voltage $V_{out}$ of an LDO odometer for different reference voltages ($V_{REF}$) in accordance with some embodiments of the present disclosure. As shown in FIG. 4, for $I_{LOAD}$=10 mA, the dropout voltage, e.g., the difference between $V_{OUT}$ and $V_{IN}$ at the point when the regulation starts, is less than 50 mV. Depending on the $V_{IN}$ and $V_{OUT}$ requirements, a corresponding $V_{REF}$ may be selected.

Figure 5A:
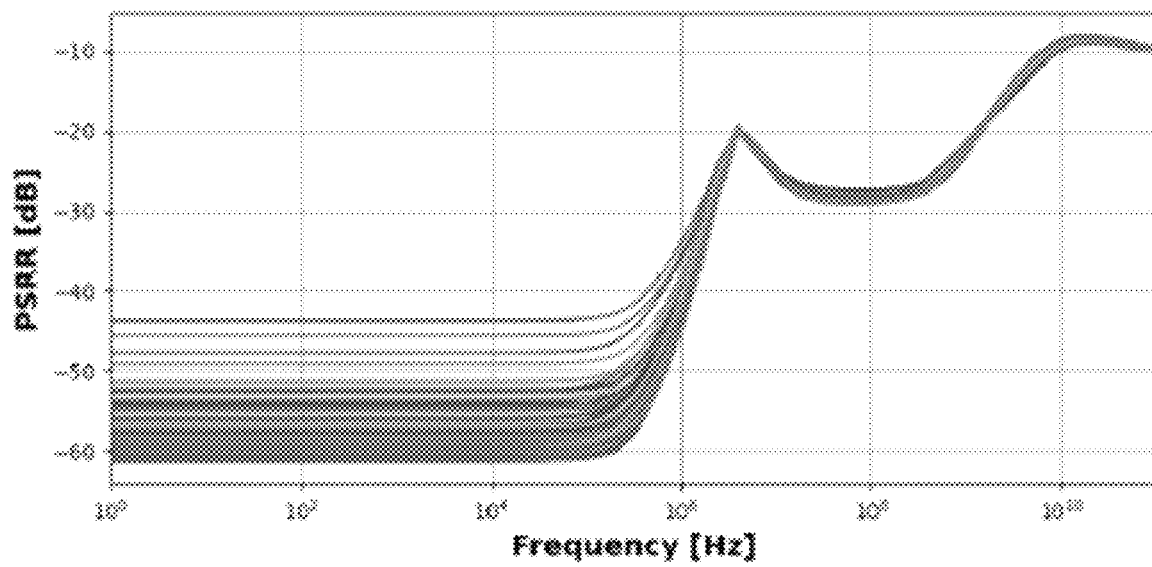
FIG. 5A illustrates exemplary Monte Carlo sampling results of LDO power supply rejection ratio (PSRR) shifts, in accordance with some embodiments of the present disclosure.
Figure 5B:
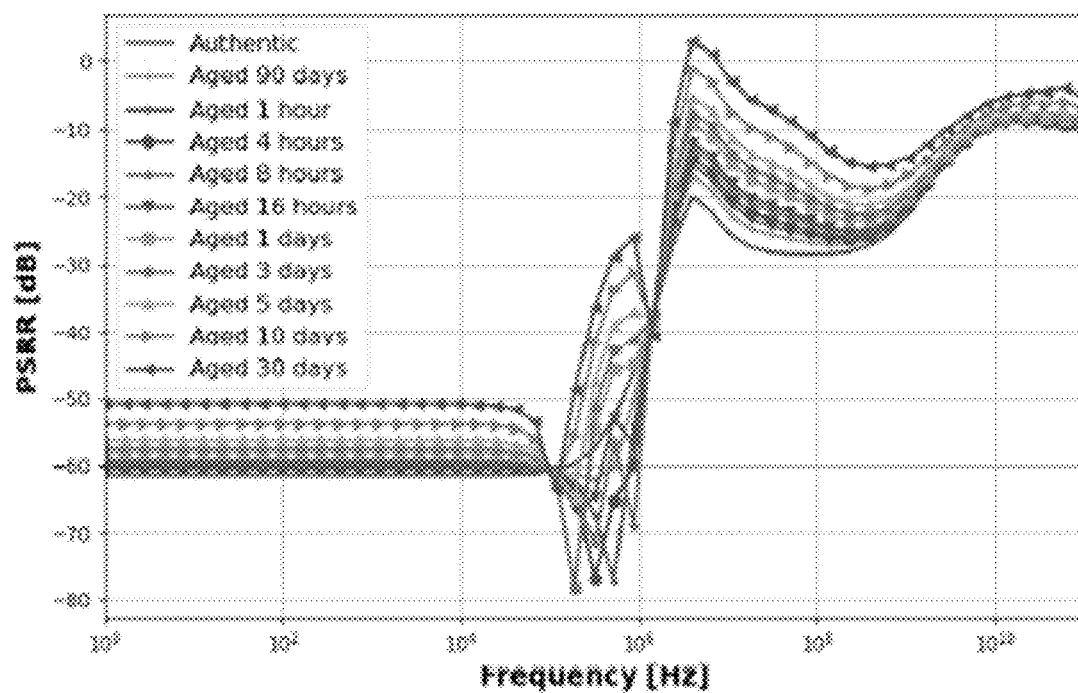
FIG. 5B illustrates simulated sampling results of PSRR shifts, in accordance with some embodiments of the present disclosure.

Monte Carlo simulations were performed to simulate different instances of an LDO odometer according to various embodiments of the present disclosure to mimic different LDO odometer ICs. FIG. 5A shows PSRR values for 100 different chip instances. Then to mimic the effects of aging, a time dependent aging model based on HCI and BTI as described above may be used to age the pass transistor for different times. For example, the changes in threshold voltage described in Equations (2) and (3) may be used and added together to get the total change in threshold voltage as a result of aging. Then the corresponding PSRR values may be recorded to get the aged PSRR values for different aging times. FIG. 5B shows PSRR values for different time stamps for a single LDO odometer chip. As depicted in FIG. 5B, the shifts of PSRR values are more distinguishable in the lower-to-mid frequency range and that the PSRR values shifts higher as the LDO chip is aged more.

Figure 6A:
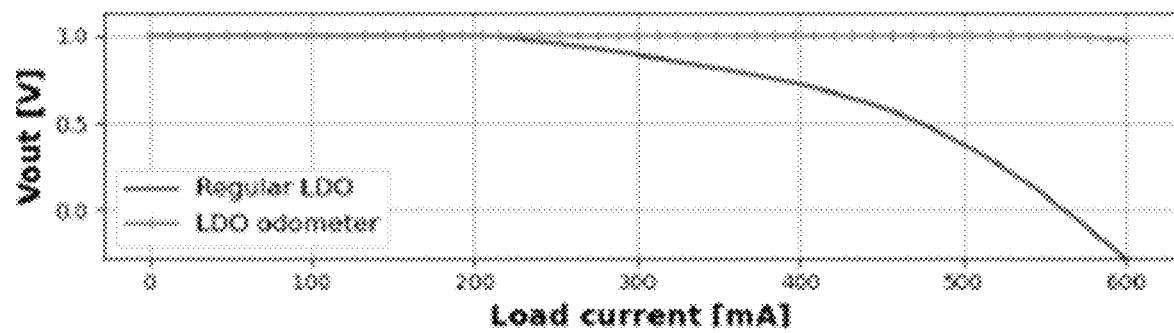
FIGS. 6A and 6B illustrate performance comparisons of an LDO, in accordance with some embodiments of the present disclosure.
Figure 6B:
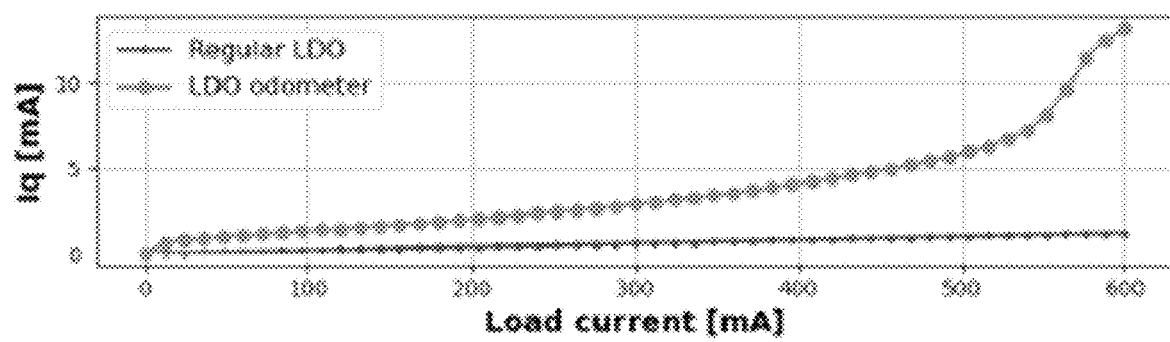

Performance of an LDO odometer according to various embodiments of the present disclosure is compared to a regular LDO of conventional design. FIG. 6A shows how the LDO odometer maintains the output voltage for loads of up to 590 mA compared to 210 mA of the regular LDO. Similarly, FIG. 6B compares the quiescent current (Iq) or the ground current of the LDO odometer to that of the regular LDO. Iq may comprise the difference between the input and the output current and is an important factor in determining current efficiency. For example, the lower the Iq, the higher the efficiency is. These results are summarized further in Table II.

TABLE II

LDO COMPARISON

| LDO metrics | Regular LDO | LDO odometer |
|---|---|---|
| PSRR @ 50 kHz | −58.835 dB | −61.379 dB |
| Iq @ Load = 0 mA | 10 µA | 8 µA |
| Nominal Vout | 1 V | 1 V |
| Dropout voltage | 53 mV | 47 mV |
| Current efficiency | 99.8% | 97.6% |

Two classifiers, as described above, were trained: a one-label classifier to classify the chip as either authentic or recycled (aged), and a regression classifier that calculates for how long the recycled chip has been aged. The one-label classifier was trained by using a one-class support vector machine (SVM) with a radial basis function (RBF) kernel. The dataset for the one-labeled classifier comprised both authentic samples and the aged samples; however, the classifier is trained using authentic PSRR samples. The authentic PSRR samples are comprised of 1000 Monte Carlo samples of the authentic LDO odometer chip. For testing, the combined dataset that consists both authentic and aged samples equally is used. The aged samples were generated using the time-based aging model as described above.

The linear regression classifier was trained on a total of 10,000 aged samples (1000 samples for each of the timestamps shown in Table III generated by aging the 1000 Monte Carlo samples of the LDO odometer). Each sample is shown as labeled by its corresponding timestamp.

TABLE III

TIMES USED TO AGE LDO ODOMETER

| Time stamps | 1 hour | 4 hours | 8 hours | 16 hours | 1 day |
|---|---|---|---|---|---|
| | 3 days | 5 days | 10 days | 30 days | 90 days |

Figure 7:
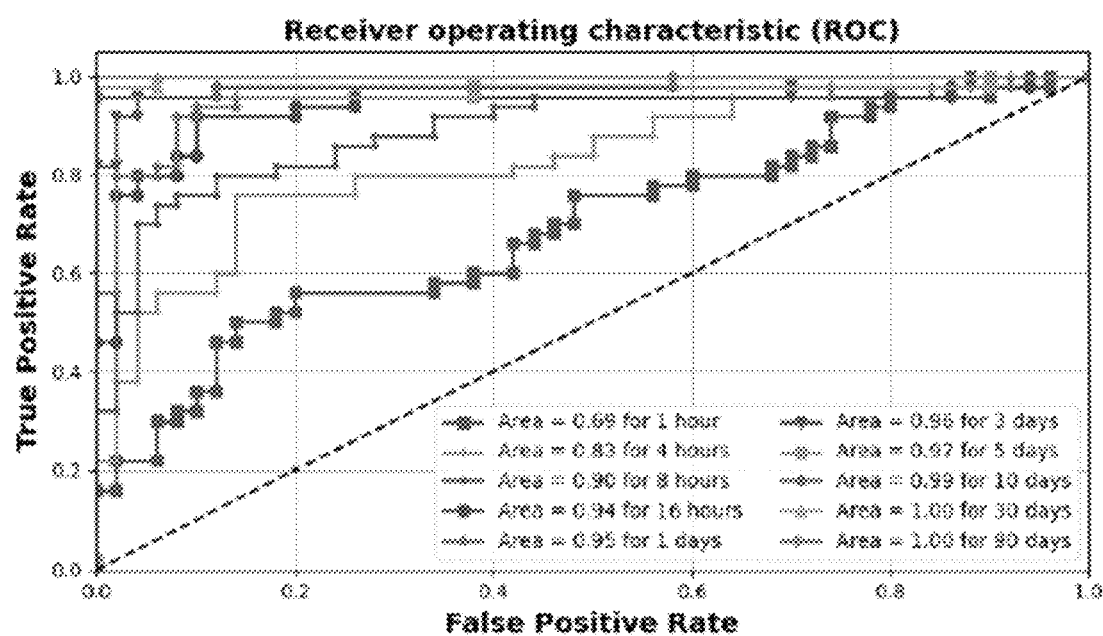
FIG. 7 illustrates results and performance of a one-label classifier, in accordance with some embodiments of the present disclosure.

The results and performance of the one-label classifier is summarized in the receiver operating characteristic (ROC) curves depicted in FIG. 7. The higher the area under the curve, the higher the performance/accuracy of the classifier for that dataset. A ROC curve may illustrate the ability of the classifier to distinguish between an inlier (belongs to the one-class) and an outlier (does not belong to that one-class) at all classification thresholds. In the example depicted, the thresholds are the 10 different increasing timestamps mentioned above and shown in FIG. 7. As depicted in FIG. 7, the area under the ROC curve increases as the thresholds are increased indicating that the classifier can detect outliers very clearly. The area is lower in the case of 1-hour aged samples because the LDO odometer has not been aged long and the shifts in PSRR is not as drastic for it to be easily discernible. The PSRR shift observed in one instance of the LDO odometer chip as a result of aging looks similar to the shift observed as a result of the manufacturing variations (see e.g., FIG. 5A). The accuracy and F1 score of the one-label SVM classifier are summarized in Table IV, and depicts the accuracy increases as the time aged increases.

TABLE IV

ACCURACY AND F1 SCORE OF ONE-CLASS SVM CLASSIFIER

| Dataset | F1 score | Accuracy |
|---|---|---|
| Authentic + Aged 1 hour | 0.30 | 0.57 |
| Authentic + Aged 4 hours | 0.51 | 0.66 |
| Authentic + Aged 8 hours | 0.68 | 0.75 |
| Authentic + Aged 16 hours | 0.82 | 0.84 |
| Authentic + Aged 1 day | 0.89 | 0.90 |
| Authentic + Aged 3 days | 0.96 | 0.96 |
| Authentic + Aged 5 days | 0.98 | 0.98 |
| Authentic + Aged 10 days | 0.98 | 0.98 |
| Authentic + Aged 30 days | 0.98 | 0.98 |
| Authentic + Aged 90 days | 0.98 | 0.98 |

To assess the performance of the linear regression classifier, a mean squared error (MSE) is used. MSE may be calculated as the average of the squared differences between all predicted and expected target values in the test dataset. The lower the MSE, the better the performance of the regression model is.

CONCLUSION

Various embodiments of the disclosure represent a new LDO design with odometer capabilities, allowing embodiments of the disclosure to determine with high accuracy if a chip is new or recycled. Many modifications and other embodiments of the disclosures set forth herein will come to mind to one skilled in the art to which these disclosures pertain having the benefit of the teachings presented in the foregoing description and the associated drawings. Therefore, it is to be understood that the disclosures are not to be limited to the specific embodiments disclosed and that modifications and other embodiments are intended to be included within the scope of the appended claims. Although specific terms are employed herein, they are used in a generic and descriptive sense only and not for purposes of limitation, unless described otherwise.

The invention claimed is:

1. A circuit for detecting a recycled counterfeit integrated circuit (IC), the circuit comprising:
   an error amplifier;
   a resistor divider;
   a reference path circuit; and
   a stressed path circuit, wherein
      an output of the error amplifier is coupled to an output of the circuit through both the reference path circuit and the stressed path circuit,
      the resistor divider is coupled between the output of the circuit and a ground,
      a first input of the error amplifier is coupled to a voltage reference signal,
      a second input of the error amplifier is coupled to an output of the resistor divider,
      the reference path circuit is coupled to a first control signal, wherein the first control signal selectively enables the reference path circuit, and
      the stressed path circuit is coupled to a second control signal, wherein the second control signal selectively enables the stressed path circuit.

2. The circuit of claim 1, wherein the reference path circuit comprises a reference pass transistor, and the stressed path circuit comprises a stressed pass transistor.

3. The circuit of claim 2, wherein:
   the reference path circuit further comprises a first pull-up transistor and a second pull-up transistor, wherein the first pull-up transistor and the second pull-up transistor are coupled to the reference pass transistor; and
   the stressed path circuit further comprises a third pull-up transistor and a fourth pull-up transistor, wherein the third pull-up transistor and the fourth pull-up transistor are coupled to the stressed pass transistor.

4. The circuit of claim 3, wherein the reference pass transistor, the stressed pass transistor, the first pull-up transistor, the second pull-up transistor, the third pull-up transistor, and the fourth pull-up transistor are P-channel metal-oxide-semiconductor (PMOS).

5. The circuit of claim 4, wherein source terminals of the reference pass transistor, the stressed pass transistor, the first pull-up transistor, the second pull-up transistor, the third pull-up transistor, and the fourth pull-up transistor are coupled to a voltage supply.

6. The circuit of claim 3, wherein:
   the reference path circuit further comprises a first inverter, an input of the first inverter is coupled to the first control signal, and an output of the first inverter is coupled to gates of the first pull-up transistor and the second pull-up transistor; and
   the stressed path circuit further comprises a second inverter, an input of the second inverter is coupled to the second control signal, and an output of the second inverter is coupled to gates of the third pull-up transistor and the fourth pull-up transistor.

7. The circuit of claim 2, wherein:
   the reference path circuit further comprises a first switch and a second switch, the output of the error amplifier is coupled to the reference pass transistor through the first switch, an output of the reference pass transistor is coupled to the output of the circuit through the second switch; and
   the stressed path circuit further comprises a third switch and a fourth switch, the output of the error amplifier is coupled to the stressed pass transistor through the third switch, an output of the stressed pass transistor is coupled to the output of the circuit through the fourth switch.

8. The circuit of claim 7, wherein the first switch, the second switch, the third switch, and the fourth switch are transmission gates.

9. The circuit of claim 7, wherein the first switch and the second switch are controlled by the first control signal, and the third switch and the fourth switch are controlled by the second control signal.

10. A method of detecting a recycled counterfeit integrated circuit (IC), the method comprising:
   forming a reference path circuit for a low-dropout regulator (LDO) on an IC, wherein the reference path circuit is coupled to a first control signal;
   forming a stressed path circuit for the LDO on the IC, wherein the stressed path circuit is coupled to a second control signal; and
   determining whether the IC is a recycled counterfeit based at least on comparison of LDO parameters measured while the stressed path circuit is enabled and LDO parameters measured while the reference path circuit is enabled, wherein the stressed path circuit is enabled by the second control signal and the reference path circuit is enabled by the first control signal.

11. The method of claim 10, wherein the reference path circuit comprises a reference pass transistor, and the stressed path circuit comprises a stressed pass transistor.

12. The method of claim 11, wherein:
   the reference path circuit further comprises a first pull-up transistor and a second pull-up transistor, wherein the first pull-up transistor and the second pull-up transistor are coupled to the reference pass transistor; and
   the stressed path circuit further comprises a third pull-up transistor and a fourth pull-up transistor, wherein the third pull-up transistor and the fourth pull-up transistor are coupled to the stressed pass transistor.

13. The method of claim 12, wherein the reference pass transistor, the stressed pass transistor, the first pull-up transistor, the second pull-up transistor, the third pull-up transistor, and the fourth pull-up transistor are PMOS.

14. The method of claim 13, wherein source terminals of the reference pass transistor, the stressed pass transistor, the first pull-up transistor, the second pull-up transistor, the third pull-up transistor, and the fourth pull-up transistor are coupled to a voltage supply.

15. The method of claim 12, wherein:
   the reference path circuit further comprises a first inverter, an input of the first inverter is coupled to the first control signal, and an output of the first inverter is coupled to gates of the first pull-up transistor and the second pull-up transistor; and
   the stressed path circuit further comprises a second inverter, an input of the second inverter is coupled to the second control signal, and an output of the second inverter is coupled to gates of the third pull-up transistor and the fourth pull-up transistor.

16. The method of claim 11, wherein:
   the reference path circuit further comprises a first switch and a second switch, an output of an error amplifier is coupled to the reference pass transistor through the first switch, an output of the reference pass transistor is coupled to an output of the IC through the second switch; and
   the stressed path circuit further comprises a third switch and a fourth switch, the output of the error amplifier is coupled to the stressed pass transistor through the third switch, an output of the stressed pass transistor is coupled to the output of the IC through the fourth switch.

17. The method of claim 16, wherein the first switch, the second switch, the third switch, and the fourth switch are transmission gates.

18. The method of claim 16, wherein the first switch and the second switch are controlled by the first control signal, and the third switch and the fourth switch are controlled by the second control signal.

19. The method of claim 10, wherein the LDO parameters comprise at least one of power supply rejection ratio (PSRR), dropout voltage, load regulation, ground current, or operating regions.

* * * * *